US010586856B2

(12) United States Patent
Loubet et al.

(10) Patent No.: US 10,586,856 B2
(45) Date of Patent: Mar. 10, 2020

(54) NANOSHEET FET DEVICE WITH EPITAXIAL NUCLEATION

(71) Applicant: International Business Machines Corporation, Armonk, NY (US)

(72) Inventors: Nicolas Loubet, Guilderland, NY (US); Julien Frougier, Albany, NY (US); Wenyu Xu, Albany, NY (US); Zhenxing Bi, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/009,196

(22) Filed: Jun. 14, 2018

(65) Prior Publication Data

US 2019/0386113 A1  Dec. 19, 2019

(51) Int. Cl.
*H01L 29/66*    (2006.01)
*H01L 21/311*   (2006.01)
*H01L 29/775*   (2006.01)

(52) U.S. Cl.
CPC .. *H01L 29/66439* (2013.01); *H01L 21/31111* (2013.01); *H01L 21/31116* (2013.01); *H01L 29/775* (2013.01)

(58) Field of Classification Search
CPC ............. H01L 51/5275; H01L 51/5036; H01L 27/3241; H01L 51/56; H01L 51/5234; H01L 27/32; H01L 51/5212
See application file for complete search history.

(56) References Cited

U.S. PATENT DOCUMENTS

| | | | |
|---|---|---|---|
| 9,276,064 B1 * | 3/2016 | Zang | H01L 29/0673 |
| 9,647,098 B2 | 5/2017 | Obradovic et al. | |
| 9,660,028 B1 | 5/2017 | Cheng et al. | |
| 9,679,780 B1 | 6/2017 | Bi et al. | |
| 9,773,886 B1 | 9/2017 | Palle et al. | |
| 9,799,748 B1 | 10/2017 | Xie et al. | |
| 9,812,321 B2 | 11/2017 | Doris et al. | |
| 10,388,729 B2 * | 8/2019 | Zhang | H01L 29/6653 |
| 2017/0213888 A1 | 7/2017 | Chang et al. | |
| 2017/0330960 A1 | 11/2017 | Bauer et al. | |
| 2017/0365604 A1 * | 12/2017 | Suh | H01L 27/0924 |
| 2018/0006113 A1 | 1/2018 | Cheng et al. | |
| 2019/0237559 A1 * | 8/2019 | Cheng | H01L 29/42392 |

* cited by examiner

*Primary Examiner* — Su C Kim
(74) *Attorney, Agent, or Firm* — Garg Law Firm, PLLC; Rakesh Garg; Joseph Petrokaitis

(57) ABSTRACT

A semiconductor device is described. The semiconductor device includes a nanosheet stack including a sacrificial nanosheet oriented substantially parallelly to a substrate and a channel nanosheet disposed on the sacrificial nanosheet. The semiconductor device includes a gate formed in a direction orthogonal to the plane of the nanosheet stack, with a gate spacer positioned along a sidewall of the gate. The semiconductor device includes an inner spacer liner deposited around the nanosheet stack and the gate spacer. A first etching of the inner spacer liner is configured to produce an outer profile of the inner spacer liner, the outer profile having a substantially flat side section relative to an edge of the channel nanosheet. A second etching of the inner spacer liner is configured to remove substantially all material of the inner spacer liner from the edge of the channel nanosheet.

17 Claims, 6 Drawing Sheets

FIGURE 3
PRIOR-ART

NANOSHEET FET DEVICE WITH EPITAXIAL NUCLEATION

TECHNICAL FIELD

The present invention relates generally to a semiconductor device, method, and semiconductor fabrication system for fabricating gate-controlled semiconductor devices. More particularly, the present invention relates to a semiconductor device, method, and semiconductor fabrication system for a nanosheet FET device with epitaxial nucleation.

BACKGROUND

Within the scope of the illustrative embodiments a gate-controlled semiconductor device is a device in which a gate structure controls a flow of electrons through a channel between a source structure and a drain structure. A transistor is a non-limiting example of a gate-controlled semiconductor device, where applying a potential to the gate causes electrical current to flow from a source end of the transistor to a drain end of the transistor.

A Field Effect Transistor (FET) is a specific type of transistor. A Metal Oxide Field Effect Transistor (MOSFET) is a FET fabricated using specific materials, techniques, and is suitable as a transistor for certain uses. A FET controls the electrical conductivity between a source of electric current (source) and a destination of the electrical current (drain). The FET uses a gate structure to create an electric field, which controls the shape and consequently the electrical conductivity of a channel between the source and the drain. The channel is a charge carrier pathway constructed using a semiconductor material.

As semiconductor integrated circuits (ICs) or chips become smaller, stacked gate-all-around (GAA) nanosheets, which are two-dimensional nanostructures with a thickness range on the order of 1 to 100 nanometers, are increasingly used to form nanosheet FETs. In GAA devices the gate wraps the entire perimeter of the channel. Due to the quantum confinement of the carriers, these FETs offer excellent short channel control, suitable for the next generation FETs, when the channel length is less than 20 nm.

SUMMARY

The illustrative embodiments provide a semiconductor device, method, and semiconductor fabrication system. An embodiment includes a semiconductor device that includes a nanosheet stack including a sacrificial nanosheet oriented substantially parallelly to a substrate and a channel nanosheet disposed on the sacrificial nanosheet. The embodiment includes a gate formed in a direction orthogonal to the plane of the nanosheet stack, with a gate spacer positioned along a sidewall of the gate. The embodiment includes an inner spacer liner deposited around the nanosheet stack and the gate spacer. In the embodiment, a first etching of the inner spacer liner is configured to produce an outer profile of the inner spacer liner, with the outer profile having a substantially flat side section relative to an edge of the channel nanosheet. In the embodiment, wherein a second etching of the inner spacer liner is configured to remove substantially all material of the inner spacer liner from the edge of the channel nanosheet.

An embodiment includes a method to fabricate a semiconductor device. The method enables a fabrication system to fabricate a nanosheet FET device with epitaxial nucleation.

An embodiment includes a semiconductor fabrication system. The semiconductor fabrication system includes a processor, a computer-readable memory, a computer-readable storage device, and program instructions stored on the storage device for execution by the processor via the memory, the stored program instructions causing the fabrication system to perform operations to fabricate a nanosheet FET device with epitaxial nucleation.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

The illustrative embodiments are described using a transistor, particularly a nanosheet FET as a specific example which can be improved in a manner described herein. Any reference to a transistor, FET, or nanosheet FET is not intended to be limiting on the illustrative embodiments. An embodiment described herein can be adapted to address similar problems in other devices where selective exposure of nanosheets is desired.

Figure 1:
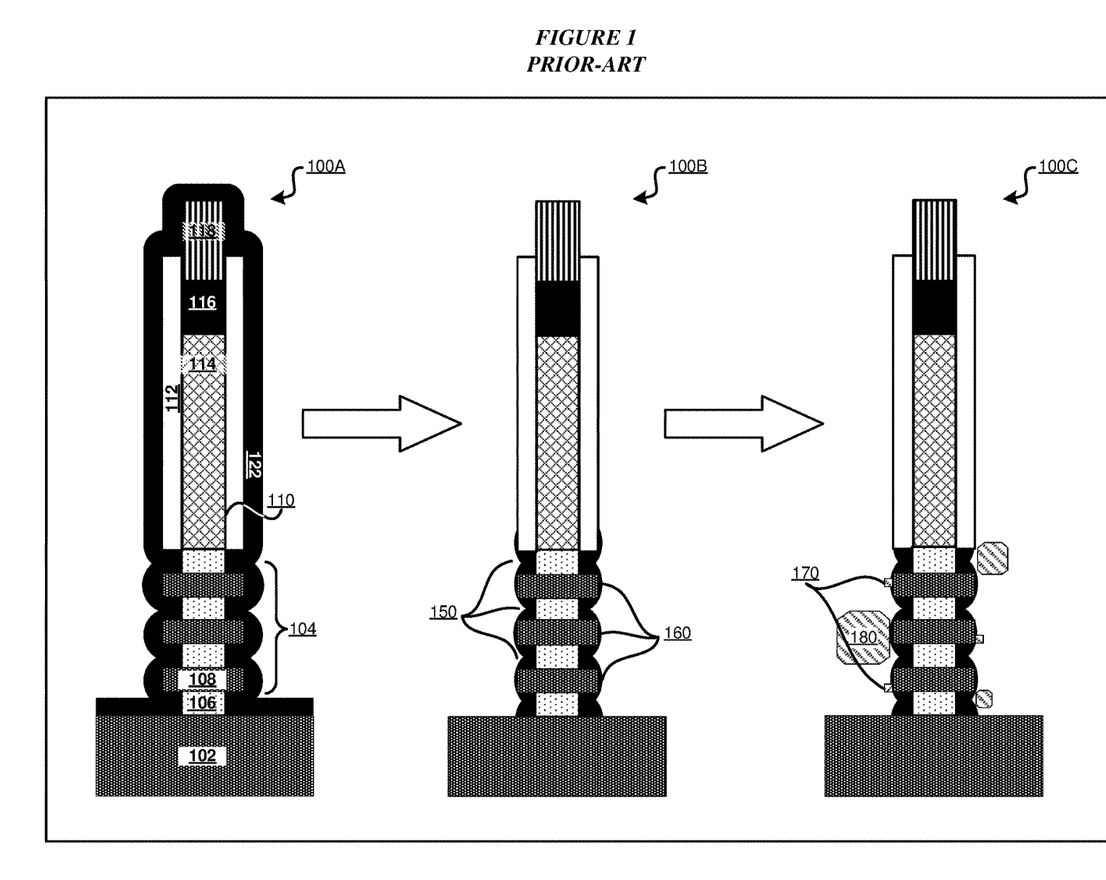
FIG. 1 illustrates, in a cross-sectional view, several steps in the formation of an example semiconductor device, formed according to a presently available process.

FIG. 1 illustrates, in a cross-sectional view, several steps in the formation of an example semiconductor device, formed according to a presently available process. Nanosheet stack 104 is oriented substantially parallelly to substrate 102, with gate 114 formed in a direction orthogonal to the plane of nanosheet stack 104. Gate cap 116 is formed on gate 114. Gate cap protector 118 is formed on gate cap 116 to protect gate cap 116 during etching. Gate spacer 112 is positioned along a sidewall of gate 114.

Gate 114 acts as a sacrificial material called "dummy gate". This "dummy gate" is usually formed of a thin liner for oxide and amorphous silicon but can comprise any suitable material, including but not limited to silicon oxide, silicon nitride (SiN), silicon oxynitride, amorphous silicon, amorphous carbon, or any suitable combination of these materials.

Gate cap 116 may be a semiconductor material, for example SiN. Gate cap protector 118 may be, for example, silicon dioxide.

Gate spacer 112 is formed using a suitable spacer material. Some examples of the spacer material include, but are not limited to, silicon nitride (SiN), silicon-carbon (SiC), silicon oxycarbide (SiOC), silicon-carbon-nitride (SiCN), boron-nitride (BN), silicon-boron-nitride (SiBN), silicon-boron-carbon-nitride (SiBCN), silicon-oxygen-nitride (SiON), and combinations thereof. The spacer material also acts as a dielectric material. The dielectric material used as spacer material can be a suitable low-k (low dielectric constant) material, such as a material having a dielectric constant less than approximately 7, or preferably less than approximately 5.

Substrate 102 can be formed using any suitable substrate material, such as, for example, monocrystalline silicon (Si), silicon-germanium (SiGe), SiC, III-V compound semiconductor, II-VI compound semiconductor, or semiconductor-on-insulator (SOI).

Nanosheet stack 104 includes alternating layers of sacrificial nanosheet 106 and channel nanosheet 108. A first instance of sacrificial nanosheet 106 contacts substrate 102. Channel nanosheet 108 is wider than the sacrificial nanosheet 106 to accommodate epitaxy (singular "epi", plural "epis") bonding. Due to these stacked widths, the vertical edge profile on either side of gate 114 where the source and drain epis are to be formed becomes uneven. This uneven vertical profile forms a jagged surface on which spacer material will have to be deposited and selectively removed before epi nucleation. Epis are not grown on sidewall spacer 122 or on gate cap 116 and gate cap protector 118 as the process is selective to dielectrics. Epitaxy nucleation only originates from opened silicon surfaces.

Sacrificial nanosheet 106 may be a semiconductor material, for example SiGe. Channel nanosheet 108 may be a semiconductor material, for example Si.

Although nanosheet stack 104 includes three layers of sacrificial nanosheet 106 and channel nanosheet 108, nanosheet stack 104 may include any number of sacrificial nanosheet 106 and channel nanosheet 108. Nanosheet stack 104 may include one or more layers of each of sacrificial nanosheet 106 and channel nanosheet 108. For example, nanosheet stack 104 may include a first instance of sacrificial nanosheet 106 positioned in contact with substrate 102 and a first instance of channel nanosheet 108 disposed on the first instance of sacrificial nanosheet 106.

Example semiconductor device 100A is depicted during a presently-available manufacturing process, after inner spacer liner 110 deposition. Inner spacer liner 110 may be a semiconductor material, for example silicon nitride. The deposition process results in a substantially uniform layer of inner spacer liner 110 around nanosheet stack 104. Because sacrificial nanosheet 106 is narrower than channel nanosheet 108, the outer profile of inner spacer liner 110 will also vary with the changing nanosheet widths, as shown at 122.

After inner spacer liner 110 deposition, a prior-art process performs an isotropic wet etch process using, for example, phosphoric acid, resulting in example semiconductor device 100B. After the isotropic wet etch process, a prior-art process forms epi 180 at the edges of channel nanosheets 108. Epi 180 may be an in-situ doped semiconductor material, for example SiGe:B (Boron doped), Si:P (Phosphorus-doped), Si:As (Arsenic doped), SiC:P, or SiC:As alloy.

The illustrative embodiments recognize that when only an isotropic wet etch process is performed on the semiconductor device, the isotropic wet etch process produces an undesirable outer profile of inner spacer liner 110. Because the isotropic wet etch process etches away a consistent depth of inner spacer liner material, after etching the outer profile of inner spacer liner 110 may continue to vary with the changing nanosheet widths, as shown at 150. As well, leftover inner spacer liner material may cover the outside edges of channel nanosheets 108, interfering with the epitaxial nucleation important in forming an effective bond between channel nanosheet 108 and epi 180, as shown at 160. As a result, epi 180 forms but nucleates only at small random points on the edges of channel nanosheets 108 where channel nanosheets 108 are completely free of inner spacer liner material. Epi 180 fails to nucleate where remnants of inner spacer material are still present on the edges and elsewhere on channel nanosheets 108. Such incomplete nucleation—as shown in example semiconductor device 100C at 170—may not form an effective bond between channel nanosheets 108 and epi 180.

Figure 2:
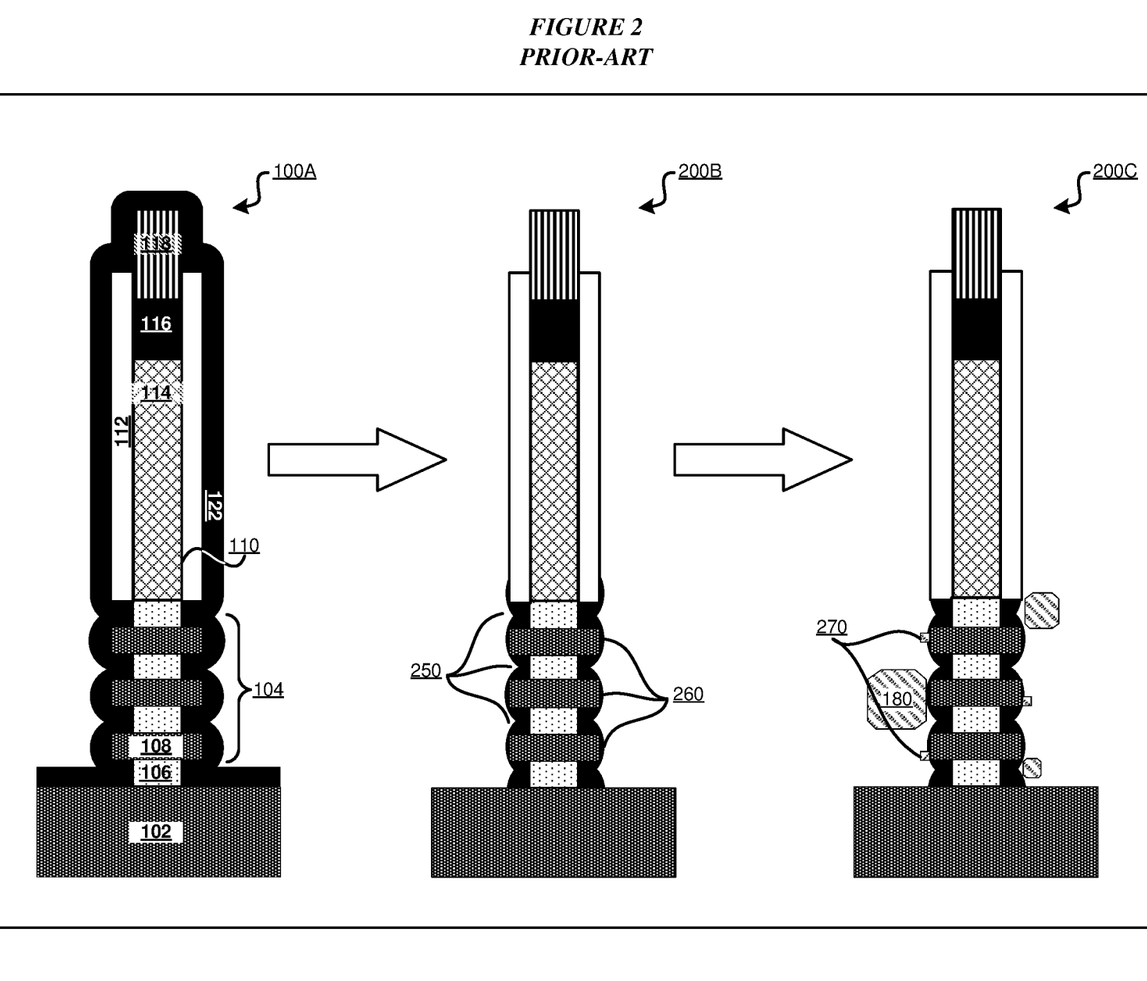
FIG. 2 illustrates, in a cross-sectional view, several steps in the formation of an example semiconductor device formed according to a presently available process.

FIG. 2 illustrates, in a cross-sectional view, several steps in the formation of an example semiconductor device formed according to a presently available process, using an isotropic dry etch process in place of the isotropic wet etch process. Example semiconductor device 100A, substrate 102, nanosheet stack 104 (including alternating layers of sacrificial nanosheet 106 and channel nanosheet 108), inner spacer liner 110, gate spacer 112, gate 114, gate cap 116, gate cap protector 118, and epi 180 are the same as example semiconductor device 100A, substrate 102, nanosheet stack 104 (including alternating layers of sacrificial nanosheet 106 and channel nanosheet 108), inner spacer liner 110, gate spacer 112, gate 114, gate cap 116, gate cap protector 118, and epi 180 in FIG. 1. Example semiconductor device 100A is depicted during a presently available manufacturing process, after inner spacer liner 110 deposition.

After inner spacer liner 110 deposition, a currently available process performs an isotropic dry etch process using a Reactive Clean Process (RCP), for example, the Certasm process, resulting in example semiconductor device 200B. (Certas is a registered trademark of Tokyo Electron Limited in Japan and other countries.) After the isotropic dry etch process, a currently available process forms epi 180 at the edges of channel nanosheets 108.

The illustrative embodiments recognize that when only an isotropic dry etch process is performed on the semiconductor device, the isotropic dry etch process produces an undesirable outer profile of inner spacer liner 110. Because the isotropic dry etch process etches away a consistent depth of inner spacer liner material, similar to the isotropic wet etch process, after etching the outer profile of inner spacer liner 110 may continue to vary with the changing nanosheet widths, as shown at 250. As well, leftover inner spacer liner material may cover the outside edges of channel nanosheets 108, interfering with the epitaxial nucleation important in forming an effective bond between channel nanosheet 108 and epi 180, as shown at 260.

As a result, epi 180 forms but nucleates only at small random points on the edges of channel nanosheet 108 where channel nanosheet 108 is completely free of inner spacer liner material. Epi 180 fails to nucleate where remnants of inner spacer material are still present on the edges and elsewhere on channel nanosheet 108. Such incomplete nucleation—as shown in example semiconductor device 200C at 270—may not form an effective bond between channel nanosheet 108 and epi 180.

Figure 3:
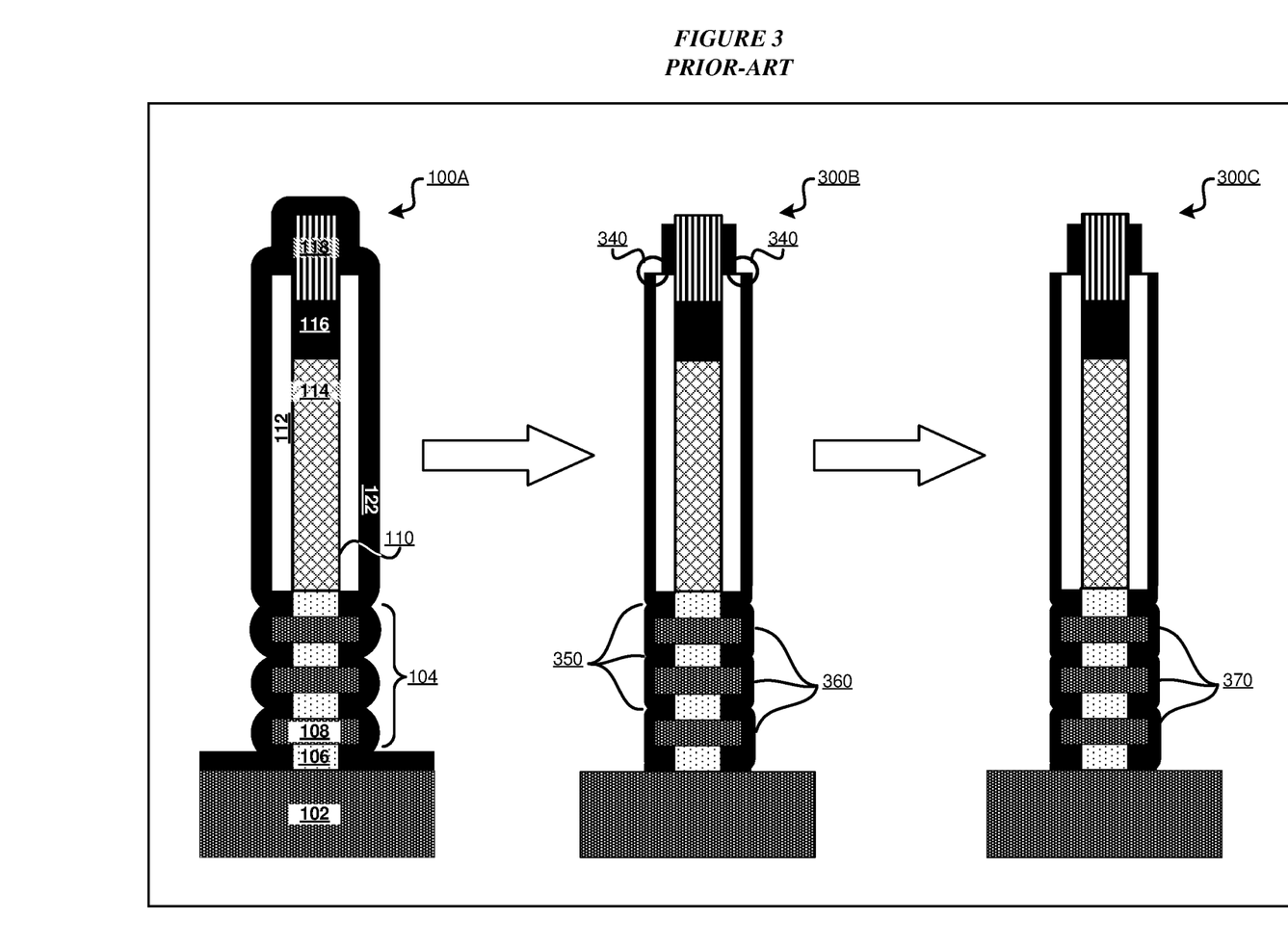
FIG. 3 illustrates, in a cross-sectional view, several steps in the formation of an example semiconductor device formed according to a presently available process.

FIG. 3 illustrates, in a cross-sectional view, several steps in the formation of an example semiconductor device formed according to a presently available process, using an anisotropic dry etch process in place of the isotropic wet etch process. Example semiconductor device 100A, substrate 102, nanosheet stack 104 (including alternating layers of sacrificial nanosheet 106 and channel nanosheet 108), inner spacer liner 110, gate spacer 112, gate 114, gate cap 116, gate cap protector 118, and epi 180 are the same as example semiconductor device 100A, substrate 102, nanosheet stack 104 (including alternating layers of sacrificial nanosheet 106 and channel nanosheet 108), inner spacer liner 110, gate spacer 112, gate 114, gate cap 116, gate cap protector 118, and epi 180 in FIG. 1. Example semiconductor device 100A is depicted during a presently available manufacturing process, after inner spacer liner 110 deposition.

After inner spacer liner 110 deposition, a prior-art process performs an anisotropic dry etch process, using, for example, a Reactive Ion Etching (RIE) process or a Radial Line Slot Antenna (RLSA) process, resulting in example semiconductor device 300B. After the anisotropic dry etch process, a prior-art process forms epi 180 at the edges of channel nanosheets 108.

The illustrative embodiments recognize that when only an anisotropic dry etch process is performed on the semiconductor device, the anisotropic dry etch process produces an improved outer profile of inner spacer liner 110 over the isotropic processes discussed herein. However, the outer profile of inner spacer liner 110 remains undesirable. Because the anisotropic dry etch process is applied from the top down, more material is etched away from inner spacer liner 110 at the top of the semiconductor device than at the bottom. As a result, after etching the outer profile of inner spacer liner 110, shown at 350, is much flatter than the outer profile shown at 150 in FIG. 1. However, leftover inner spacer liner material may still cover the outside edges of nanosheet stack 104, as shown at 370. Without exposed edges of channel nanosheet 108, it will not be possible to effectively nucleate epi 180 at 370. Further, there is a risk of over etch at the top PC, as shown at 340, potentially resulting in damage to gate cap 116 and gate cap protector 118.

The illustrative embodiments recognize that improved etching of inner spacer liner 110 would improve bonding of nanosheet stack 104 to the epitaxial layer.

The illustrative embodiments used to describe the invention generally address and solve the above-described needs and other problems related to fabricating a nanosheet FET device with epitaxial nucleation. The illustrative embodiments provide a fabrication method for a nanosheet FET device with epitaxial nucleation.

An embodiment comprises a semiconductor device described herein. Another embodiment comprises a fabrication process for the contemplated semiconductor device and can be implemented as a software application. The software application implementing an embodiment can be configured as a modification of an existing semiconductor fabrication system—such as a photolithography system, as a separate application that operates in conjunction with an existing semiconductor fabrication system, a standalone application, or some combination thereof. For example, the application causes the semiconductor fabrication system to perform the steps described herein, to fabricate an asymmetric air spacer gate-controlled device with reduced parasitic capacitance, as described herein.

For the clarity of the description, and without implying any limitation thereto, the illustrative embodiments are described using a specific type of gate-controlled device, to wit, generally a FET and specifically a nanosheet FET. Within the scope of the illustrative embodiments, an embodiment can be implemented with a variety of other devices, where etching of a liner layer poses similar epitaxial bonding problems as are recognized with a nanosheet FET.

Furthermore, simplified diagrams of the example structures, elements, and device(s) are used in the figures and the illustrative embodiments. In an actual fabrication of a proposed device, additional structures that are not shown or described herein, or structures different from those shown and described herein, may be present without departing the scope of the illustrative embodiments. Similarly, within the scope of the illustrative embodiments, a shown or described structure in the example device may be fabricated differently to yield a similar operation or result as described herein.

Differently shaded portions in the two-dimensional drawing of the example structures, layers, and formations are intended to represent different structures, layers, and formations in the example fabrication, as described herein. The different structures, layers, and formations may be fabricated using suitable materials that are known to those of ordinary skill in the art as belonging to the same class of materials described herein.

A specific shape, location, position, or dimension of a shape depicted herein is not intended to be limiting on the illustrative embodiments unless such a characteristic is expressly described as a feature of an embodiment. The shape, location, position, dimension, or some combination thereof, are chosen only for the clarity of the drawings and the description and may have been exaggerated, minimized, or otherwise changed from actual shape, location, position, or dimension that might be used in actual photolithography to achieve an objective according to the illustrative embodiments.

Furthermore, the illustrative embodiments are described with respect to a specific actual or hypothetical semiconductor device only as an example. The steps described by the various illustrative embodiments can be adapted for fabricating a variety of planar and non-planar devices in a similar manner, and such adaptations are contemplated within the scope of the illustrative embodiments. The specific contact placements are also used only as non-limiting examples to describe certain options possible with the illustrative embodiments. Those of ordinary skill in the art will be able to use an embodiment to similarly provide electrical access to a layer or structure in a similar manner, and such usage is also contemplated within the scope of the illustrative embodiments.

An embodiment when implemented in an application causes a fabrication process to perform certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

A device of an embodiment described herein, comprises substantial advancement of the semiconductor device fabrication technologies. A manner of forming a nanosheet FET device with epitaxial nucleation bonding as described herein is unavailable in the presently available methods. Presently available methods produce undesirable out profiles of inner space liner 110, interfering with epitaxial nucleation important in forming effective bonds between nanosheets and adjacent epi. Thus, a substantial advancement of such devices or data processing systems by executing a method of an embodiment is in an improved fabrication process where competing objectives are achieved from improved epitaxial nucleation in the fabricated device.

The illustrative embodiments are described with respect to certain types of devices, electrical properties, structures, formations, layers, orientations, directions, steps, operations, planes, materials, dimensions, numerosity, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

The illustrative embodiments are described using specific code, designs, architectures, protocols, layouts, schematics, and tools only as examples and are not limiting to the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures.

The examples in this disclosure are used only for the clarity of the description and are not limiting to the illustrative embodiments. Additional structures, operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 4:
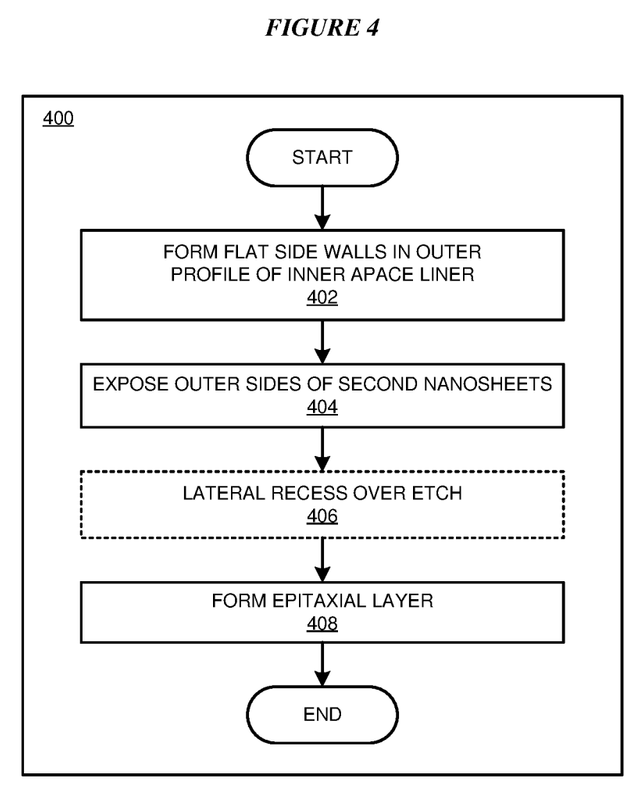
FIG. 4 depicts a flowchart showing several example steps in fabricating a nanosheet FET device with epitaxial nucleation according to an illustrative embodiment.

FIG. 4 depicts a flowchart showing several example steps in fabricating a nanosheet FET device with epitaxial nucleation according to an illustrative embodiment. First, in step 402, a process, for example an anisotropic dry etch process, may be performed that results in flat side walls in the outer profile of inner space liner 110 at nanosheet stack 104. Next, in step 404, a process, for example an isotropic wet etch or isotropic dry etch process, may be performed to expose the outer sides of channel nanosheets 108. Next, in optional step 406, a lateral recess over etch may be performed to expose additional areas of the top and bottom of channel nanosheets 108. Finally, in step 408, an epi is formed at the edges of channel nanosheets 108.

Figure 5:
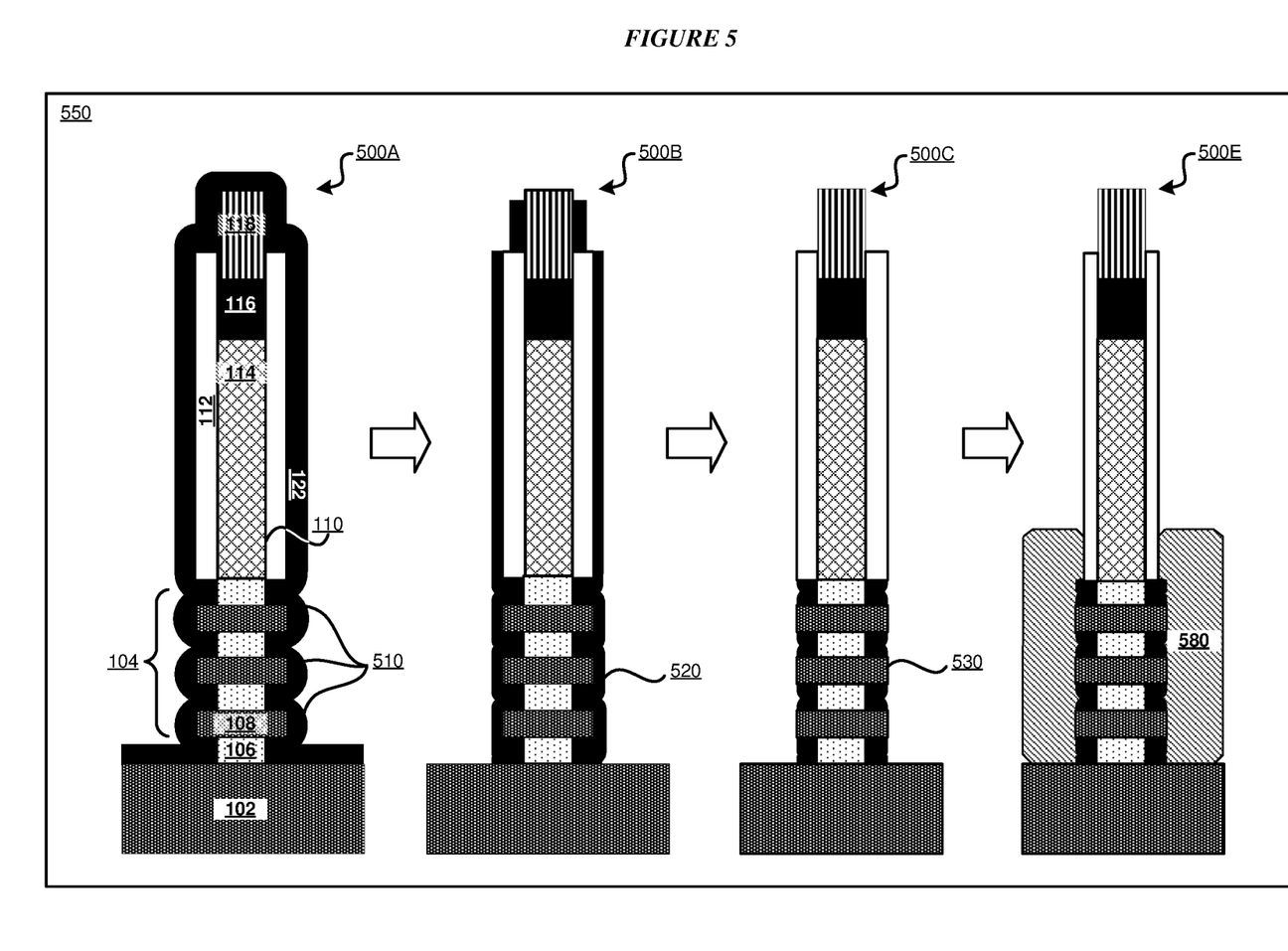
FIG. 5 depicts the results of the several example steps shown in FIG. 4 in fabricating a nanosheet FET device with epitaxial nucleation according to an illustrative embodiment.

FIG. 5 depicts the results of the several example steps shown in FIG. 4 in fabricating a nanosheet FET device with epitaxial nucleation according to an illustrative embodiment. A fabrication process for nanosheet FET fabrication uses a wafer of a suitable substrate, such as silicon, and fabricates device 500A. Device 500A is a semiconductor device and comprises a set of transistors. Substrate 102, nanosheet stack 104 (including alternating layers of sacrificial nanosheet 106 and channel nanosheet 108), inner spacer liner 110, gate spacer 112, gate 114, gate cap 116, and gate cap protector 118 are the same as substrate 102, nanosheet stack 104 (including alternating layers of sacrificial nanosheet 106 and channel nanosheet 108), inner spacer liner 110, gate spacer 112, gate 114, gate cap 116, and gate cap protector 118 in FIG. 1.

Device 500A is depicted during a manufacturing process according to an illustrative embodiment, after inner spacer liner 110 deposition. The deposition process results in a substantially uniform layer of inner spacer liner 110 around nanosheet stack 104. Because sacrificial nanosheet 106 is narrower than channel nanosheet 108, the outer profile of inner spacer liner 110 will also vary with the changing nanosheet widths, as shown at 510.

After inner spacer liner 110 deposition, an illustrative embodiment performs a process that results in the outer profile of inner spacer liner 110 having a substantially flat side section of substantially uniform thickness adjacent to nanosheet stack 104. An anisotropic dry etch process is an example of a process producing the desired results, but other processes or combinations of processes, which could be employed to achieve a similar result, are also contemplated within the scope of the illustrative embodiments. Because the non-limiting example anisotropic dry etch process is applied from the top down, more material is etched away from inner spacer liner 110 at the top of the semiconductor device than at the bottom. Device 500B results. In contrast to devices 100B and 200B, which have outer profiles that vary with changing nanosheet widths (illustrated at 150 and 250), device 500B has an outer profile of inner spacer liner 110 with a substantially flat side section of substantially uniform thickness adjacent to nanosheet stack 104, as illustrated at 520.

Next, an illustrative embodiment performs a process on device 500B that results in the outer profile of inner spacer liner 110 being flush with the outer sides of channel nanosheet 108, exposing the outer sides of channel nanosheet 108. An isotropic wet etch or isotropic dry etch process are examples of processes producing the desired results, but other processes or combinations of processes, which could be employed to achieve a similar result, are also contemplated within the scope of the illustrative embodiments. Because such a non-limiting example process etches away a consistent depth of inner spacer liner material, after etching the outer profile of inner spacer liner 110 is flush with the outer sides of channel nanosheet 108, resulting in device 500C. The flush profile of device 500C, shown at 530, exposes the outer sides of channel nanosheet 108, allowing epitaxial nucleation at the outer sides of channel nanosheet 108. This nucleation forms an effective bond between channel nanosheet 108 and epi 580, as illustrated at 550, resulting in device 500E.

Figure 6:
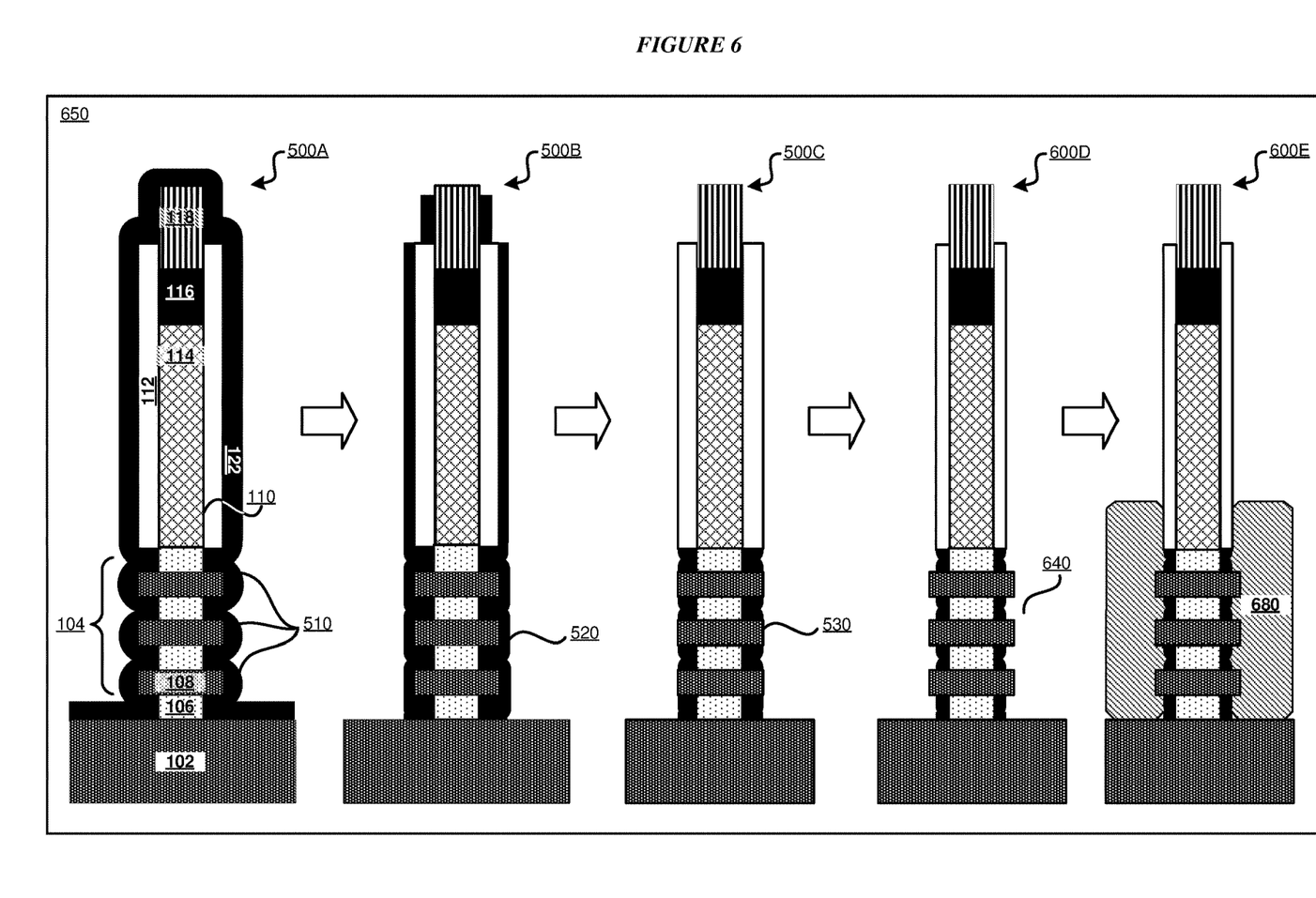
FIG. 6 depicts the results of the several example steps shown in FIG. 4 in fabricating a nanosheet FET device with epitaxial nucleation according to a further illustrative embodiment.

FIG. 6 depicts the results of the several example steps shown in FIG. 4 in fabricating a nanosheet FET device with epitaxial nucleation according to a further illustrative embodiment. Substrate 102, nanosheet stack 104 (including alternating layers of sacrificial nanosheet 106 and channel nanosheet 108), inner spacer liner 110, gate spacer 112, gate 114, gate cap 116, and gate cap protector 118 are the same as substrate 102, nanosheet stack 104 (including alternating layers of sacrificial nanosheet 106 and channel nanosheet 108), inner spacer liner 110, gate spacer 112, gate 114, gate cap 116, and gate cap protector 118 in FIG. 1. Devices 500A, 500B, and 500C and locations 510, 520, and 530 are the same as devices 500A, 500B, and 500C and locations 510, 520, and 530 in FIG. 5.

A lateral recess over etch process, performed on device 500C to expose additional areas of the top and bottom of channel nanosheet 108 and epi 180 to form device 600D, may further improve the effectiveness of the bond between channel nanosheet 108 and epi 680. The desired results may be accomplished by any suitable means, for example by continuing a previous isotropic etch process, or performing an additional etch process. For example, the additional etch process could be performed with diluted or changed chemistry. Other processes or combinations of processes, which could be employed to achieve a similar result, are also contemplated within the scope of the illustrative embodiments. After the lateral recess over etch, the outer profile of inner spacer liner 110 of device 600D exposes additional areas of the top and bottom of channel nanosheet 108, as illustrated at 640. The additional exposed area of channel nanosheet 108 provides silicon-germanium epitaxial growth with even more improved nucleation between channel nanosheet 108 and epi 180, further improving the nanosheet-epitaxial layer bond.

Finally, epi 680 is formed at the exposed portions of channel nanosheets 108 of device 600D, resulting in device 600E.

While certain steps and processes are described with certain structures, it is to be understood that the steps and/or processes can be adapted to fabricate any of the structure variations described herein within the scope of the illustrative embodiments. While certain materials are used in multiple layers or structures, it is to be understood that substitute materials or different but functionally equivalent materials can be used in place of the described materials at any layers described herein within the scope of the illustrative embodiments. While certain fabrication methods have been used at certain steps, it is to be understood that a fabrication method may be omitted, added, or modified at a described step to achieve functionally similar result from the semiconductor structure within the scope of the illustrative embodiments. While certain operations are described as a "step," several operations can be combined together to form a single fabrication step in a process described herein. While certain orientations have been referred to as "top" and "bottom" with reference to an example vertical orientation of the proposed device, it is to be understood that the device can be reoriented laterally such that the top and bottom become left/right or right/left, or bottom and top, or front/back or back/front, as the reorientation case may be.

Thus, a semiconductor device, fabrication method therefor, and a fabrication system or apparatus therefor using a software implementation of the method, are provided in the illustrative embodiments for a nanosheet FET device with epitaxial nucleation and other related features, functions, or operations. Where an embodiment or a portion thereof is described with respect to a type of semiconductor device, the fabrication method, system or apparatus, the software implementation, or a portion thereof, are adaptable or configurable for use with a different manifestation of that type of device.

The present invention may be a semiconductor device, system, a method, and/or a computer program product at any possible technical detail level of integration. The computer program product may include a computer readable storage medium (or media) having computer readable program instructions thereon for causing a processor to carry out aspects of the present invention. A computer readable storage medium, including but not limited to computer-readable storage devices as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network.

What is claimed is:

1. A semiconductor device comprising:
   a nanosheet stack comprising a sacrificial nanosheet oriented substantially parallelly to a substrate and a channel nanosheet disposed on the sacrificial nanosheet;
   a gate formed in a direction orthogonal to the plane of the nanosheet stack, a gate spacer positioned along a sidewall of the gate; and
   an inner spacer liner deposited around the nanosheet stack and the gate spacer,
      wherein a first etching of the inner spacer liner is configured to produce an outer profile of the inner spacer liner, the outer profile having a substantially flat side section relative to an edge of the channel nanosheet,
      wherein a second etching of the inner spacer liner is configured to remove substantially all material of the inner spacer liner from the edge of the channel nanosheet, and
      wherein following the second etching, a third etching is configured to remove the material of the inner spacer liner from a top surface and a bottom surface adjacent to the edge of the channel nanosheet.

2. The semiconductor device of claim 1, wherein the third etching comprises a lateral recess over etch process, and wherein the third etching is performed by continuing the second etching.

3. The semiconductor device of claim 1, wherein the third etching comprises a lateral recess over etch process, and wherein the third etching is performed using an isotropic etch process configured to use diluted chemistry relative to the second etching.

4. The semiconductor device of claim 1, wherein the third etching comprises a lateral recess over etch process, and wherein the third etching is performed using an isotropic etch process configured to use changed chemistry relative to the second etching.

5. The semiconductor device of claim 1, wherein the first etching is performed using an anisotropic dry etch process.

6. The semiconductor device of claim 1, wherein the second etching is performed using one of (i) an isotropic wet etch process and (ii) an isotropic dry etch process.

7. A method comprising:
   forming a nanosheet stack comprising a sacrificial nanosheet oriented substantially parallelly to a substrate and a channel nanosheet disposed on the sacrificial nanosheet;
   forming a gate positioned in a direction orthogonal to the plane of the nanosheet stack, a gate spacer positioned along a sidewall of the gate;
depositing an inner spacer liner around the substrate, the nanosheet stack, and the gate spacer;
   first etching, following the depositing, the inner spacer liner to produce an outer profile of the inner spacer liner, the outer profile having a substantially flat side section relative to an edge of the channel nanosheet;
   second etching the inner spacer liner, wherein the second etching is configured to remove substantially all material of the inner spacer liner from the edge of the channel nanosheet;
   then, performing epitaxial nucleation to bond the exposed portion of the channel nanosheet to an epitaxial layer; and
   following the second etching, third etching to remove the material of the inner spacer liner from a top surface and a bottom surface adjacent to the edge of the channel nanosheet.

8. The method of claim 7, wherein the third etching comprises a lateral recess over etch process, and wherein the third etching is performed by continuing the second etching.

9. The method of claim 7, wherein the third etching comprises a lateral recess over etch process, and wherein the third etching is performed using an isotropic etch process configured to use diluted chemistry relative to the second etching.

10. The method of claim 7, wherein the third etching comprises a lateral recess over etch process, and wherein the third etching is performed using an isotropic etch process configured to use changed chemistry relative to the second etching.

11. The method of claim 7, wherein the first etching is performed using an anisotropic dry etch process.

12. The method of claim 7, wherein the second etching is performed using one of (i) an isotropic wet etch process and (ii) an isotropic dry etch process.

13. A semiconductor fabrication system comprising a processor, a computer-readable memory, and a computer-readable storage device, and program instructions stored on the storage device for execution by the processors via the memories, the stored program instructions causing the fabrication system to perform operations comprising:

forming a nanosheet stack comprising a sacrificial nanosheet oriented substantially parallelly to a substrate and a channel nanosheet disposed on the sacrificial nanosheet;

forming a gate formed in a direction orthogonal to the plane of the nanosheet stack, a gate spacer positioned along a sidewall of the gate; and forming an inner spacer liner deposited around the nanosheet stack and the gate spacer, wherein a first etching of the inner spacer liner is configured to produce an outer profile of the inner spacer liner, the outer profile having a substantially flat side section relative to an edge of the channel nanosheet, wherein a second etching of the inner spacer liner is configured to remove substantially all material of the inner spacer liner from the edge of the channel nanosheet, and wherein following the second etching, a third etching is configured to remove the material of the inner spacer liner from a top surface and a bottom surface adjacent to the edge of the channel nanosheet.

14. The semiconductor fabrication system of claim 13, wherein the third etching comprises a lateral recess over etch process, and wherein the third etching is performed by continuing the second etching.

15. The semiconductor fabrication system of claim 13, wherein the third etching comprises a lateral recess over etch process, and wherein the third etching is performed using an isotropic etch process configured to use diluted chemistry relative to the second etching.

16. The semiconductor fabrication system of claim 13, wherein the third etching comprises a lateral recess over etch process, and wherein the third etching is performed using an isotropic etch process configured to use changed chemistry relative to the second etching.

17. The semiconductor fabrication system of claim 13, wherein the first etching is performed using an anisotropic dry etch process.

* * * * *